US009378874B2

(12) United States Patent
Sato et al.

(10) Patent No.: US 9,378,874 B2
(45) Date of Patent: *Jun. 28, 2016

(54) CERAMIC ELECTRONIC COMPONENT

(71) Applicant: Murata Manufacturing Co., Ltd., Nagaokakyo-shi, Kyoto-fu (JP)

(72) Inventors: Koji Sato, Nagaokakyo (JP); Yukio Sanada, Nagaokakyo (JP); Yasuhiro Nishisaka, Nagaokakyo (JP); Masaki Hirota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 24 days.

This patent is subject to a terminal disclaimer.

(21) Appl. No.: 14/320,770

(22) Filed: Jul. 1, 2014

(65) Prior Publication Data

US 2014/0312743 A1    Oct. 23, 2014

Related U.S. Application Data

(63) Continuation of application No. 13/187,617, filed on Jul. 21, 2011, now Pat. No. 8,804,302.

(30) Foreign Application Priority Data

Jul. 21, 2010    (JP) ................................. 2010-164114

(51) Int. Cl.
*H01L 41/083* (2006.01)
*H01C 7/00* (2006.01)
(Continued)

(52) U.S. Cl.
CPC .................. *H01C 7/008* (2013.01); *H01C 7/13* (2013.01); *H01F 17/0013* (2013.01);
(Continued)

(58) Field of Classification Search
CPC ...... H01L 41/083; H01L 41/047; H01L 41/39
USPC .............................. 310/366; 361/306.3, 321.1
See application file for complete search history.

(56) References Cited

U.S. PATENT DOCUMENTS 7,190,566 B2 *  3/2007  Tonogai .................. H01G 4/30
                                            361/303
7,342,767 B2 *  3/2008  Naito ................... H01G 4/1236
                                             29/25.42
(Continued)

OTHER PUBLICATIONS

Sato et al.; "Ceramic Electronic Component"; U.S. Appl. No. 13/187,617, filed Jul. 21, 2011.

*Primary Examiner* — Shawki S Ismail
*Assistant Examiner* — Bryan Gordon
(74) *Attorney, Agent, or Firm* — Keating & Bennett, LLP

(57) ABSTRACT

A ceramic electronic component includes a ceramic base, first and second internal electrodes, and first and second external electrodes. The first external electrode is disposed at a first end portion of a first major surface in the longitudinal direction. The second external electrode is disposed at a second end portion of the first major surface in the longitudinal direction. A portion of each of the first and second external electrodes is opposed in the thickness direction to a region where the first and second internal electrodes are opposed to each other in the thickness direction. A condition $(1/10)t_0 \leq t_1 \leq (2/5)t_0$ is satisfied, where $t_0$ is the thickness of each of the first and second external electrodes and $t_1$ is the thickness of a portion in which each of the first and second external electrodes is embedded in the first major surface.

11 Claims, 12 Drawing Sheets

(51) Int. Cl.
  *H01G 4/12* (2006.01)
  *H01G 4/232* (2006.01)
  *H01G 4/30* (2006.01)
  *H01C 7/13* (2006.01)
  *H01F 17/00* (2006.01)
  *H01G 4/012* (2006.01)

(52) U.S. Cl.
  CPC ............... *H01G 4/012* (2013.01); *H01G 4/12* (2013.01); *H01G 4/232* (2013.01); *H01G 4/30* (2013.01); *H01L 41/083* (2013.01)

(56) References Cited

U.S. PATENT DOCUMENTS

| | | | |
|---|---|---|---|
| 8,319,594 B2* | 11/2012 | Sato | H01G 4/232 336/200 |
| 2006/0234022 A1* | 10/2006 | Liu | H01G 2/22 428/210 |
| 2008/0048821 A1* | 2/2008 | Miura | C04B 35/01 338/22 SD |
| 2009/0310279 A1* | 12/2009 | Sasabayashi | C04B 35/4682 361/321.4 |

* cited by examiner

CERAMIC ELECTRONIC COMPONENT

BACKGROUND OF THE INVENTION

1. Field of the Invention

The present invention relates to a ceramic electronic component.

2. Description of the Related Art

With a reduction in the size and thickness of an electronic device, such as a cellular phone and a portable music player, the size of a circuit board mounted on the electronic device has also been reduced. In response to this, there is a great need for a reduction in the thickness and size of a ceramic electronic component included on the circuit board.

One example of an approach to reducing the thickness of a ceramic electronic component is a method of embedding an external electrode in a major surface of a ceramic base described in Japanese Unexamined Patent Application Publication No. 2005-44921. The ceramic electronic component produced by this method can be thinner than the type in which an external electrode is not embedded in a ceramic base.

This patent literature also describes an increase in the adhesion of an external electrode by embedding the external electrode in the ceramic base.

However, if a reduction in the thickness is achieved by embedding an external electrode in a ceramic base, as described in the above-mentioned patent literature, the reliability of the ceramic electronic component may decrease.

SUMMARY OF THE INVENTION

Accordingly, preferred embodiments of the present invention provide a highly reliable thin ceramic electronic component.

According to a preferred embodiment of the present invention, a ceramic electronic component includes a ceramic base, first and second internal electrodes, and first and second external electrodes. The ceramic base includes first and second opposed major surfaces extending along a longitudinal direction and a width direction, first and second opposed side surfaces extending along the longitudinal direction and a thickness direction, and first and second opposed end surfaces extending along the width direction and the thickness direction. The first and second internal electrodes are disposed in the ceramic base such that at least a portion of one of the first internal electrode is opposed to at least a portion of the second internal electrode in the thickness direction. The first external electrode includes a first section disposed on a first end portion of the first major surface in the longitudinal direction and is electrically coupled to the first internal electrode. The second external electrode includes a first section disposed on a second end portion of the first major surface and is electrically coupled to the second internal electrode. A region where the first and second internal electrodes are opposed to each other in the thickness direction defines an effective region that exhibits a specific electric characteristic. The first section of each of the first and second external electrodes is opposed to the effective region in the thickness direction. The first section of each of the first and second external electrodes is embedded in the ceramic base along the thickness direction. A condition $(1/10)t_0 \leq t_1 \leq (2/5)t_0$ is satisfied, where $t_0$ is a thickness of the first section of each of the first and second external electrodes and $t_1$ is a thickness of a portion in which the first section of each of the first and second external electrodes is embedded in the ceramic base.

For the ceramic electronic component according to a specific preferred embodiment of the present invention, $L/T<0.22$ may preferably be satisfied, where L is the length of the ceramic base and T is the thickness of the ceramic base.

With various preferred embodiments of the present invention, because $(1/10)t_0 \leq t_1 \leq (2/5)t_0$ is satisfied, both a reduction in the thickness and an increase in the reliability of a ceramic electronic component can be achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

A preferred embodiment of the present invention is described below using a ceramic electronic component 1 illustrated in FIG. 1 as an example. The ceramic electronic component 1 is merely an example of a preferred embodiment of the present invention. The present invention is not limited to the ceramic electronic component 1 and a method of producing it described below.

Figure 1:
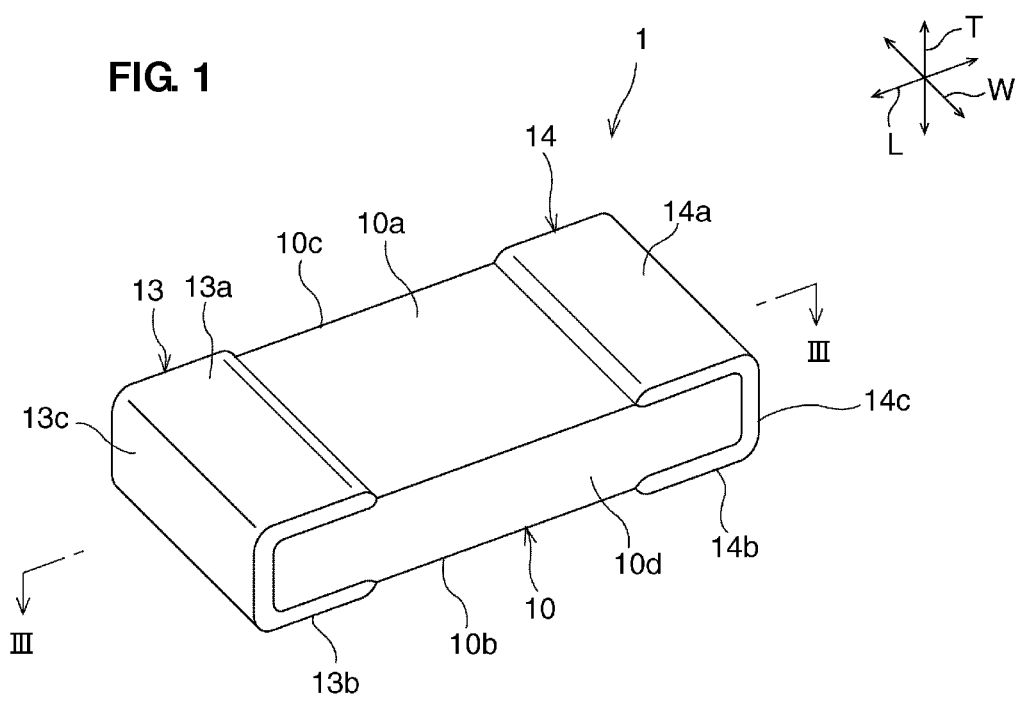
FIG. 1 is a schematic perspective view of a ceramic electronic component according to a first preferred embodiment of the present invention.
Figure 2:
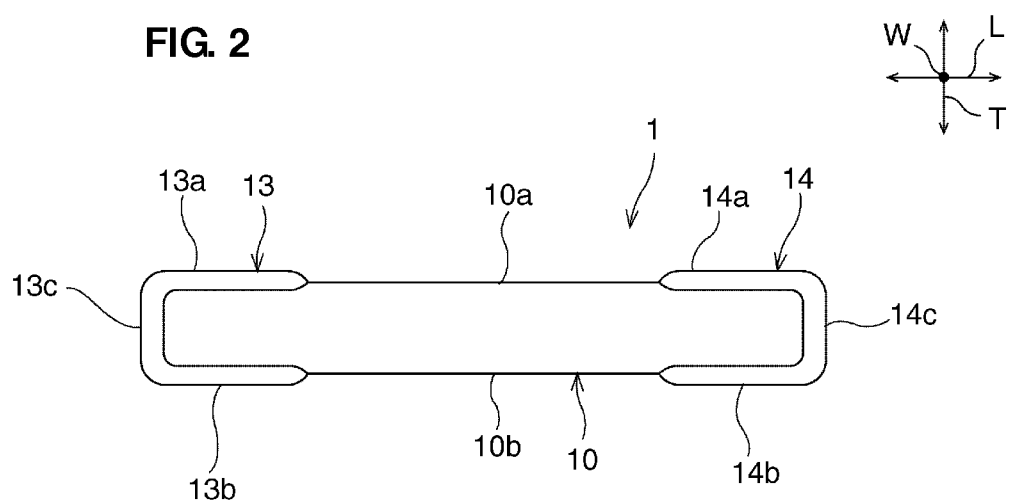
FIG. 2 is a schematic side view of the ceramic electronic component according to the first preferred embodiment of the present invention.
Figure 3:
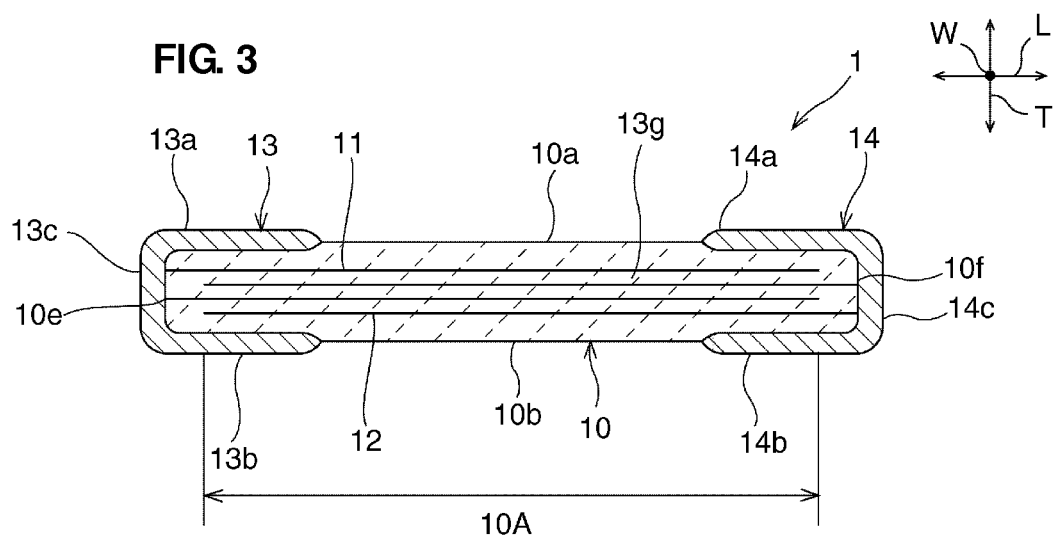
FIG. 3 is a schematic cross-sectional view taken along the line III-III in FIG. 1.
Figure 4:
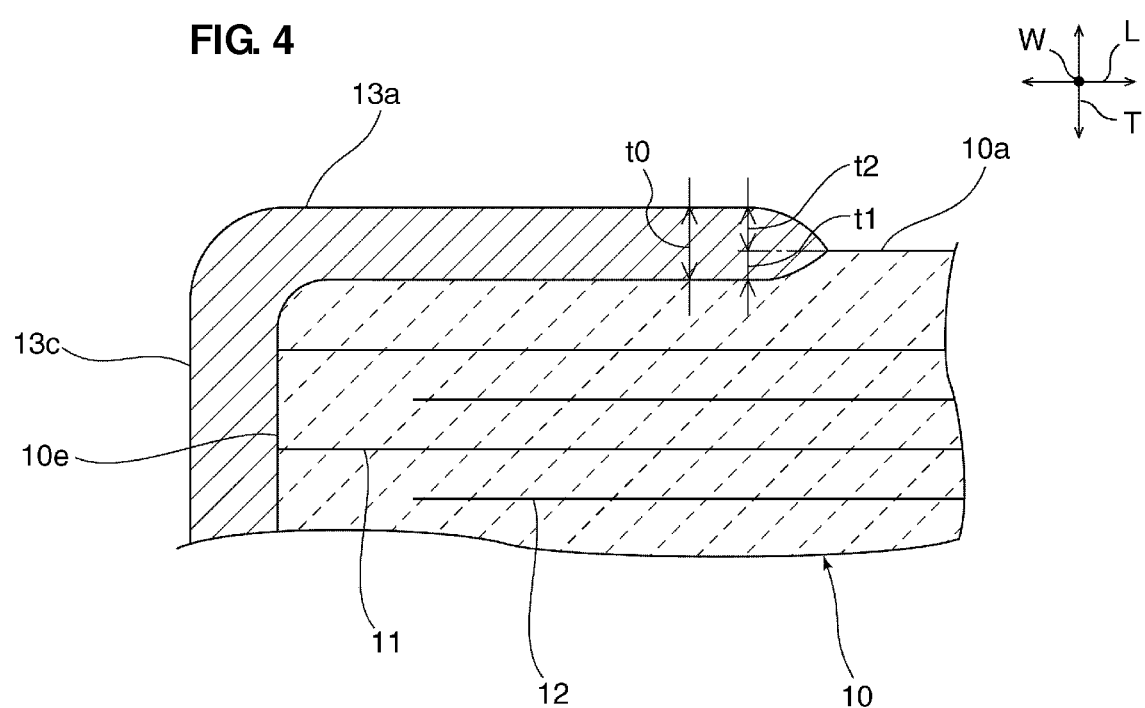
FIG. 4 is a schematic diagram in which the ceramic electronic component according to the first preferred embodiment of the present invention is enlarged in part.

FIG. 1 is a schematic perspective view of a ceramic electronic component according to a first preferred embodiment of the present invention. FIG. 2 is a schematic side view of the ceramic electronic component according to the first preferred embodiment of the present invention. FIG. 3 is a schematic cross-sectional view taken along the line III-III in FIG. 1. FIG. is a schematic diagram in which the ceramic electronic component according to the first preferred embodiment of the present invention is enlarged in part.

First, an exemplary configuration of the ceramic electronic component 1 is described with reference to FIGS. 1 to 4.

As illustrated in FIGS. 1 to 3, the ceramic electronic component 1 includes a ceramic base 10. The ceramic base 10 is preferably made of a ceramic material that corresponds to the function of the ceramic electronic component 1. Specifically, when the ceramic electronic component 1 is a capacitor, the ceramic base 10 can be made of a dielectric ceramic material. Specific examples of the dielectric ceramic material can include barium titanate ($BaTiO_3$), calcium titanate ($CaTiO_3$), strontium titanate ($SrTiO_3$), and calcium ziroconium oxide ($CaZrO_3$). Depending on the desired properties of the ceramic electronic component 1, an accessory ingredient, such as a manganese compound, a magnesium compound, a silicon compound, an iron compound, a chromium compound, a cobalt compound, a nickel compound, or a rear-earth compound, may be added to the above-described ceramic material as the main ingredient.

When the ceramic electronic component 1 is a ceramic piezoelectric element, the ceramic base 10 can be made of a piezoelectric ceramic material. A specific example of the piezoelectric ceramic material can be lead zirconate titanate (PZT) ceramic material.

When the ceramic electronic component 1 is a thermistor element, the ceramic base 10 can be made of a semiconductor ceramic material. A specific example of the semiconductor ceramic material can be a spinel ceramic material.

When the ceramic electronic component 1 is an inductor element, the ceramic base 10 can be made of a magnetic ceramic material. A specific example of the magnetic ceramic material can be a ferrite ceramic material.

The ceramic base 10 has a substantially rectangular parallelepiped shape. As illustrated in FIGS. 1 to 3, the ceramic base 10 includes first and second major surfaces 10a and 10b, first and second side surfaces 10c and 10d, and first and second end surfaces 10e and 10f. As illustrated in FIGS. 1 to 3, the first and second major surfaces 10a and 10b extend along the longitudinal direction L and the width direction W. As illustrated in FIG. 1, the first and second side surfaces 10c and 10d extend along the thickness direction T and the longitudinal direction L. As illustrated in FIG. 3, the first and second end surfaces 10e and 10f extend along the thickness direction T and the width direction W.

In this specification, the "substantially rectangular parallelepiped shape" includes rectangular parallelepiped shapes whose corners and/or ridges are chamfered and/or rounded. That is, a member having the "substantially rectangular parallelepiped shape" indicates a general member including first and second major surfaces, first and second side surfaces, and first and second end surfaces. A portion or all of the major surfaces, side surfaces, and end surfaces may have a depression and/or projection. That is, each of the major surfaces, side surfaces, and end surfaces does not necessarily have to be flat.

The ceramic base 10 is not particularly limited to a particular dimension. When the thickness dimension is T, the longitudinal dimension is L, and the width dimension is W of the ceramic base 10, it may preferably be a thin structure that satisfies $T \leq W < L$, $\frac{1}{5}W \leq T \leq \frac{1}{2}W$, and $T \leq 0.3$ mm, for example. Specifically, $0.1$ mm $\leq T \leq 0.3$ mm, $0.4$ mm $\leq L \leq 1$ mm, and $0.2$ mm $\leq W \leq 0.5$ mm may be preferable, for example.

The thickness of a ceramic layer 10g (see FIG. 3) is not particularly limited. The thickness of the ceramic layer 10g can be about 0.5 μm to about 10 μm, for example.

As illustrated in FIG. 3, a plurality of first and second internal electrodes 11 and 12 having a substantially rectangular shape are disposed inside the ceramic base 10. The first and second internal electrodes 11 and 12 are alternately arranged at regular intervals along the thickness direction $\leq T \leq$ and are substantially in parallel with the first and second major surfaces 10a and 10b.

As illustrated in FIG. 3, each of the first internal electrodes 11 extends along the longitudinal direction L and the width direction W. The first internal electrode 11 is exposed to the first end surface 10e of the ceramic base 10 and extends from the first end surface 10e toward the second end surface 10f. The first internal electrode 11 does not reach the second end surface 10f and the first and second side surfaces 10c and 10d. Each of the second internal electrodes 12 also extends along the longitudinal direction L and the width direction W. As illustrated in FIG. 3, the second internal electrode 12 is exposed to the second end surface 10f of the ceramic base 10 and extends from the second end surface 10f toward the first end surface 10e. The second internal electrode 12 does not reach the first end surface 10e and the first and second side surfaces 10c and 10d. The first and second internal electrodes 11 and 12 are disposed at substantially the same location in the width direction W. Thus, in the substantially central portion in the longitudinal direction L of the ceramic base 10, the first and second internal electrodes 11 and 12 are opposed to each other such that the ceramic layer 10g is positioned therebetween. The first and second internal electrodes 11 and 12 are not opposed to each other in the thickness direction T at the opposite edges of the ceramic base 10 in the longitudinal direction L.

The ceramic base 10 includes a region where the first and second internal electrodes 11 and 12 are opposed to each other. This region defines an effective region 10A serving the function as a capacitor.

The material of each of the first and second internal electrodes 11 and 12 is not particularly limited. For example, the first and second internal electrodes 11 and 12 can be made of a metal, such as nickel, copper, silver, palladium, or gold, and an alloy that contains at least one of these metals, such as an alloy of silver and palladium.

The thickness of each of the first and second internal electrodes 11 and 12 is also not particularly limited. The thickness of each of the first and second internal electrodes 11 and 12 can be about 0.3 μm to about 2 μm, for example.

As illustrated in FIGS. 1 to 3, first and second external electrodes 13 and 14 are disposed on the surface of the ceramic base 10. The first external electrode 13 is electrically coupled to the first internal electrode 11. The first external electrode 13 includes a first section 13a on the first major surface 10a, a second section 13b on the second major surface 10b, and a third section 13c on the first end surface 10e. For the present preferred embodiment, the first external electrode 13 preferably extends over the end of each of the first and second side surfaces 10c and 10d by a small amount. Specifically, the length of the first external electrode 13 on each of the first and second side surfaces 10c and 10d along the longitudinal direction $\leq L \leq$ is shorter than one-half of the first section 13a along the longitudinal direction L. The first external electrode does not substantially project from each of the first and second side surfaces 10c and 10d along the width direction W. In this way, the dimension in the width direction W of the ceramic electronic component 1 can be reduced. Alternatively, substantially no first external electrode 13 may be disposed on the first and second side surfaces 10c and 10d.

The second external electrode 14 is electrically coupled to the second internal electrode 12. The second external electrode 14 includes a first section 14a on the first major surface 10a, a second section 14b on the second major surface 10b, and a third section 14c on the second end surface 10f. For the present preferred embodiment, the second external electrode 14 extends over the edge of each of the first and second side surfaces 10c and 10d by a small amount. Specifically, the length of the second external electrode 14 on each of the first and second side surfaces 10c and 10d along the longitudinal direction L is shorter than one-half of the first section 14a along the longitudinal direction L. The second external electrode 14 does not substantially project from each of the first and second side surfaces 10c and 10d along the width direction W. In this way, the dimension in the width direction W of the ceramic electronic component 1 can be reduced. Alternatively, substantially no second external electrode 14 may be disposed on the first and second side surfaces 10c and 10d.

The first and second external electrodes 13 and 14 can be made of a metal, such as nickel, copper, silver, palladium, or gold, and an alloy that contains at least one of these metals, such as an alloy of silver and palladium, for example.

Each of the first and second external electrodes 13 and 14 preferably includes an inorganic binder. The inorganic binder is an ingredient included to increase the strength of bonding to the ceramic base 10. When the first and second external electrodes 13 and 14 are made by co-firing, the inorganic binder is also called a common material and may be a ceramic material of the same type as the ceramic material contained in the ceramic base 10, for example. The inorganic binder may be a ceramic material whose main ingredient is the same as that of the ceramic material contained in the ceramic base 10. When the first and second external electrodes 13 and 14 are made by post-firing, the inorganic binder may also be a glass ingredient, for example.

The content of the inorganic binder of each of the first and second external electrodes 13 and 14 may preferably be in the range of about 40% by volume to about 60% by volume, for example.

Figure 12:
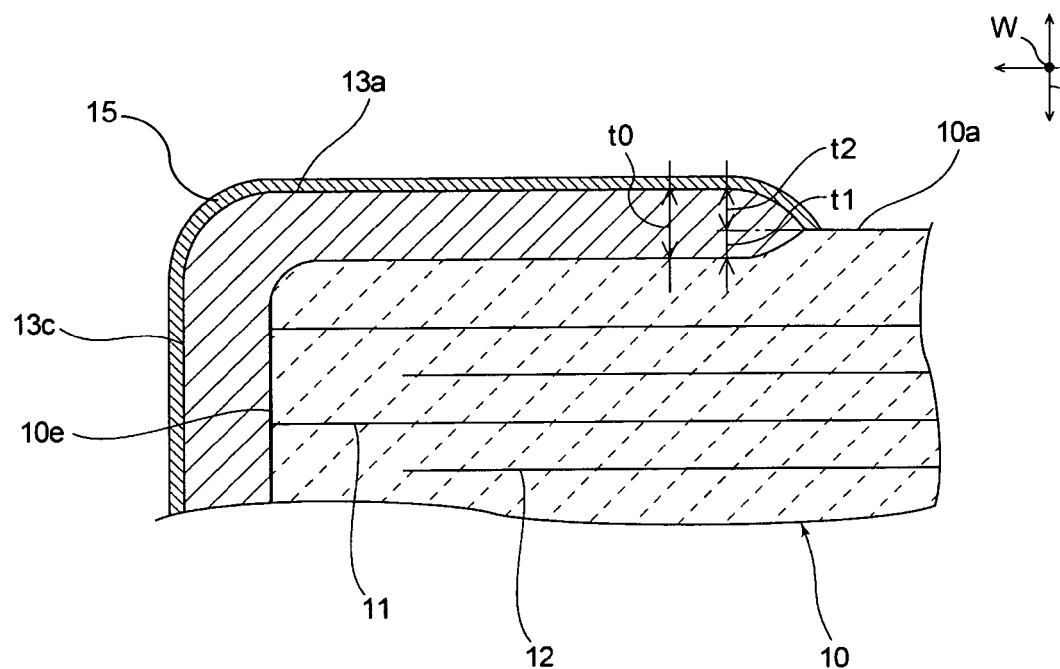
FIG. 12 is a schematic diagram in which the ceramic electronic component according to a modification of the first preferred embodiment of the present invention is enlarged in part.

A plating layer 15, as shown in FIG. 12, may be disposed on the first and second external electrodes 13 and 14. The plating layer 15 may include a plurality of layers. The plating layer 15 may preferably be made of a metal selected form the group consisting of copper, nickel, tin, lead, gold, silver, palladium, aluminum, bismuth, and zinc or an alloy that contains the metal, for example.

In particular, when the ceramic electronic component 1 is embedded in a circuit board, the outermost plating layer may preferably be made of a metal selected from the group consisting of copper, gold, silver, and aluminum or an alloy that contains the metal, for example. This is because, if a laser beam that can pass through the circuit board is emitted toward the first and second external electrodes 13 and 14 in embedding, these metals can efficiently reflect that laser beam.

The thickness of a single plating layer may preferably be about 1 μm to about 10 μm, for example.

For the present preferred embodiment, a portion of each of the first and second sections 13a and 13b of the first external electrode 13 and the first and second sections 14a and 14b of the second external electrode 14 is opposed to the effective region 10A in the thickness direction T.

A portion of the first sections 13a and 14a of the first and second external electrodes 13 and 14 is embedded in the first major surface 10a, and a portion of the second sections 13b and 14b thereof is embedded in the second major surface 10b. Thus, of the first and second major surfaces 10a and 10b, a portion on which the first and second sections 13a, 13b, 14a, and 14b are disposed is more centered in the thickness direction than a portion on which the first and second sections 13a, 13b, 14a, and 14b are not disposed.

For the present preferred embodiment, $(1/10)t_0 \leq t_1 \leq (2/5)t_0$ is preferably satisfied, where to is the thickness of each of the first and second sections 13a and 13b of the first external electrode 13 and the first and second sections 14a and 14b of the second external electrode 14 (exclusive of the thickness of the plating layer) and $t_1$ is the thickness of each of the portion in which the first sections 13a and 14a of the first and second external electrodes 13 and 14 are embedded in the first major surface 10a and the portion in which the second sections 13b and 14b thereof are embedded in the second major surface 10b. Therefore, both a reduced thickness and increased reliability of the ceramic electronic component can be achieved.

If $t_1$ is less than $(1/10)t_0$, the adherence of the first and second sections 13a and 13b of the first external electrode 13 and the first and second sections 14a and 14b of the second external electrode 14 to the ceramic base 10 is so low that the first and second sections 13a, 13b, 14a, and 14b tend to be separated from the ceramic base 10 and this may reduce the reliability. Also, if $t_1$ is less than $(1/10)t_0$, the thickness $t_2$ of a portion in which the first and second sections 13a and 13b of the first external electrode 13 and the first and second sections 14a and 14b of the second external electrode 14 are not embedded in the ceramic base 10 is too large and this may lead to an insufficient reduction in the thickness of the ceramic electronic component.

In contrast, if $t_1$ is more than $(2/5) \cdot t_0$, the reliability of the ceramic electronic component may decrease. The reason for this can be that a large stress applied to the first and second internal electrodes 11 and 12 when the first sections 13a and 14a and the second sections 13b and 14b are embedded in the first and second major surfaces 10a and 10b, respectively, may damage the first and second internal electrodes and 12, and this may result in being unable to acquire a desired capacity or may cause a short circuit.

For the present preferred embodiment, to can be about 3 μm to about 20 μm, for example.

An example method of manufacturing the ceramic electronic component 1 according to the present preferred embodiment is described next.

Figure 5:
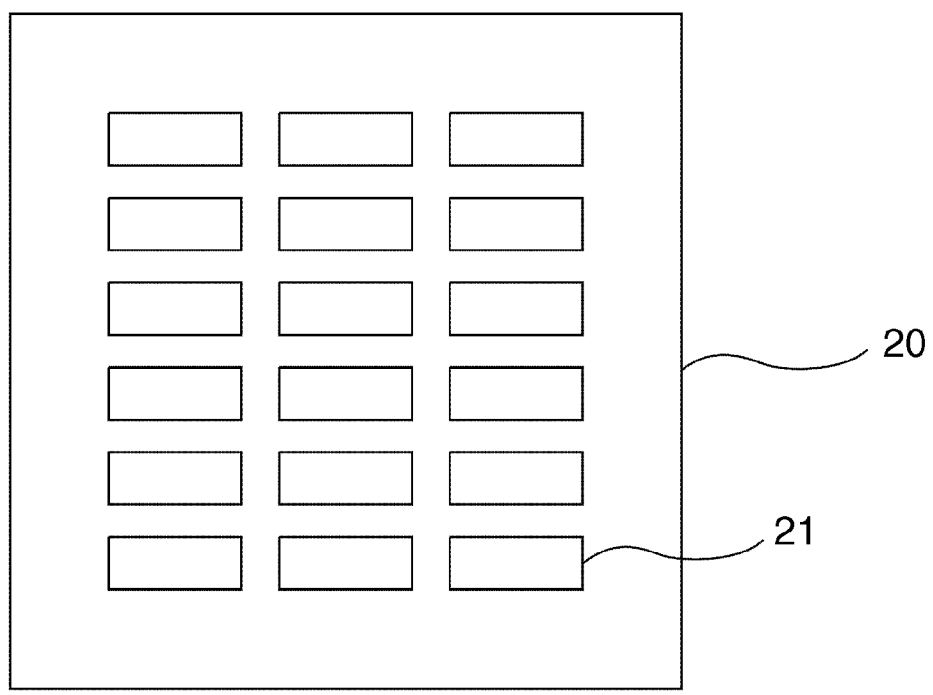
FIG. 5 is a schematic plan view of a ceramic green sheet on which a conductive pattern is formed.

First, a ceramic green sheet 20 (see FIG. 5) that contains a ceramic material for use in forming the ceramic base 10 is prepared. Then, as illustrated in FIG. 5, conductive paste is applied onto the ceramic green sheet 20 to form a conductive pattern 21. The conductive paste can be applied by various printing processes, including screen printing. The conductive paste may contain a publicly known binder or solvent, in addition to conductive particles.

Figure 6:
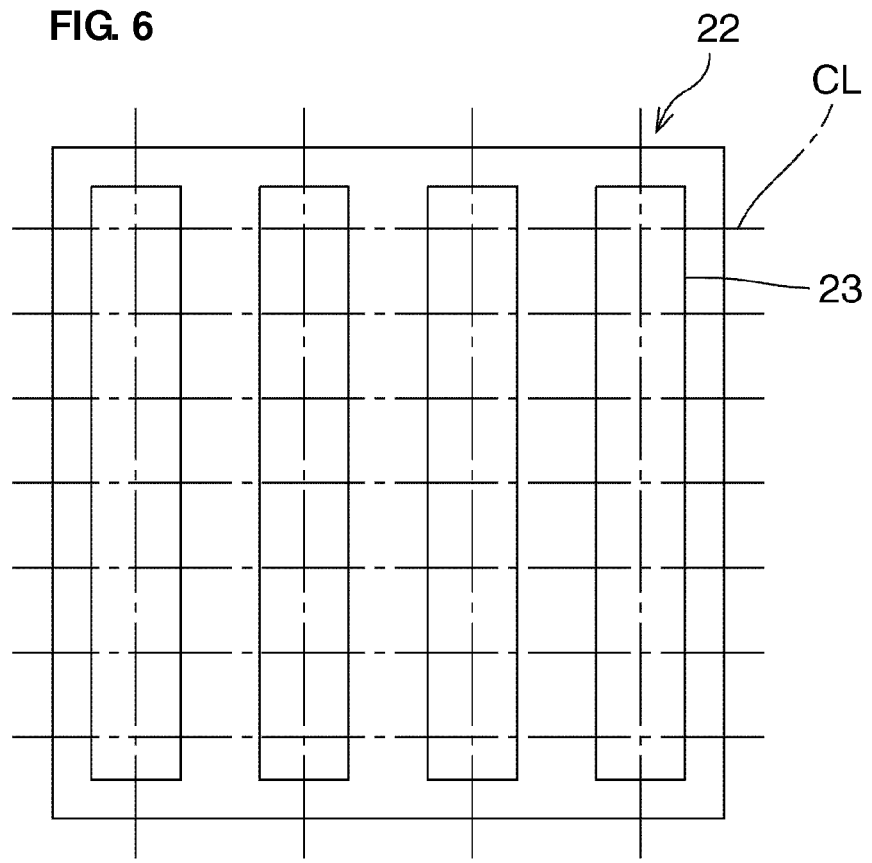
FIG. 6 is a schematic plan view of a mother laminate.

Then, a ceramic green sheet 20 on which no conductive pattern 21 is formed and another ceramic green sheet 20 on which the conductive pattern 21 is formed are stacked such that they are displaced from each other along the longitudinal direction L, and they are pressed by, for example, a hydrostatic press, in the stacking direction to produce a mother laminate 22 illustrated in FIG. 6.

Then, as illustrated in FIG. 6, a conductive pattern 23 corresponding to the shape of a portion that is to define the first and second sections 13a and 13b of the first external electrode 13 and the first and second sections 14a and 14b of the second external electrode 14 is formed on the mother laminate 22 by an appropriate process, such as screen printing.

Then, the mother laminate 22 is pressed again by, for example, a hydrostatic press, in the stacking direction. With this pressing step, the conductive pattern 23 is partially embedded. The amount of embedment of the conductive pattern 23 can be adjusted by adjustment of, for example, the amount of pressing, the pressure of pressing, or hardness or modulus of elasticity of a member that comes into contact with the mother laminate 22 in pressing.

Figure 7:
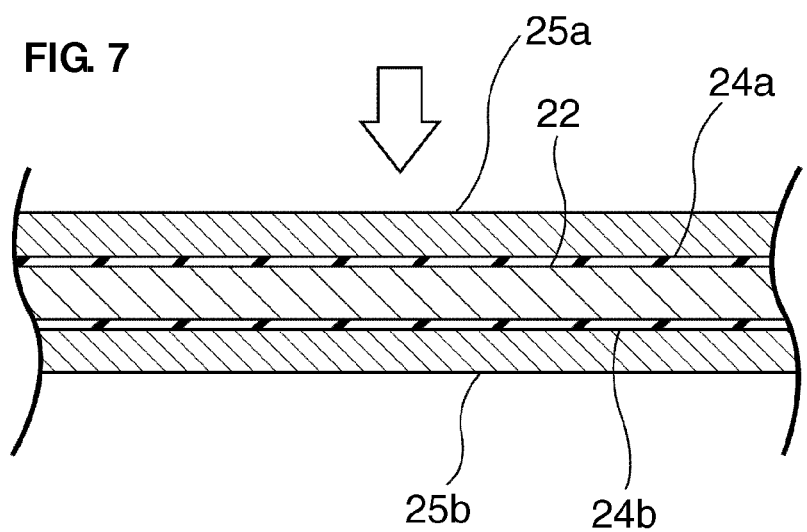
FIG. 7 is a schematic cross-sectional view for describing a step of pressing the mother laminate.

Specifically, for example, if the mother laminate 22 is pressed while no elastic body is present between an opposing die and each of both major surfaces of the mother laminate 22, the amount of embedment of the conductive pattern 23 is large. In contrast, as illustrated in FIG. 7, if the mother laminate 22 is pressed while elastic bodies 24a and 24b, such as rubber, are present between an opposing die and both major surfaces of the mother laminate 22, the amount of embedment is relatively small. The amount of embedment can be adjusted by adjustment of, for example, the modulus of elasticity of the elastic bodies 24a and 24b.

Then, the mother laminate 22 is cut along an imaginary cut line CL to produce a plurality of green ceramic laminates from the mother laminate 22. The mother laminate 22 can be cut by dicing or by pressing down.

After the production of green ceramic laminates, their corners and ridges may be chamfered or rounded and their surface layers may be polished by barrel polishing or other polishing processes.

After that, conductive paste is applied on both end surfaces of each of the green ceramic laminates by, for example, dipping. With this, a conductive paste layer is also formed on both end surfaces of the ceramic laminate.

Then, the green ceramic laminate is fired. In this firing step, the above-described conductive paste layer is fired at the same time (co-fired). The co-firing temperature can be set to any value by selecting the type of a ceramic material or conductive paste to be used. The co-firing temperature can be set to about 900° C. to about 1300° C., for example.

After that, polishing, such as barrel polishing, is preferably performed.

The formation of the first and second external electrodes 13 and 14 is completed by the application of plating onto the conductive paste layer formed by co-firing.

Other preferred embodiments of the present invention are described below. In the following description, members having substantially the same function as in the first preferred embodiment are referred to by the same reference numerals, and the detailed description thereof is omitted.

Second Preferred Embodiment

Figure 8:
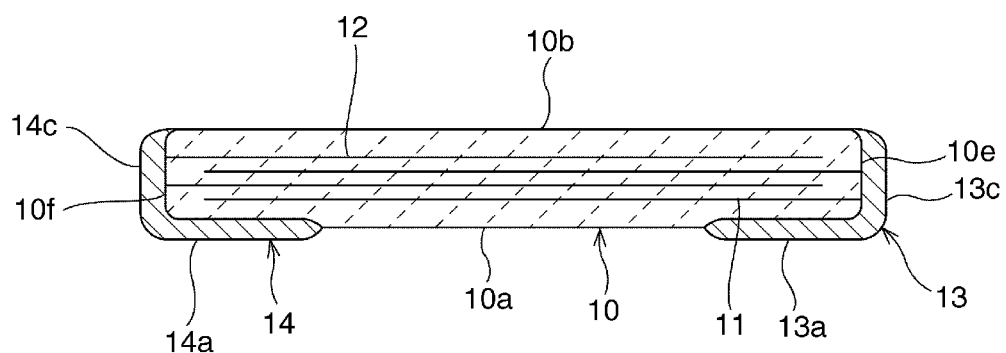
FIG. 8 is a schematic perspective view of a ceramic electronic component according to a second preferred embodiment of the present invention.

FIG. 8 is a schematic perspective view of a ceramic electronic component according to a second preferred embodiment of the present invention.

The first preferred embodiment is an example in which both the first and second external electrodes 13 and 14 are disposed on each of the first and second major surfaces 10a and 10b. However, preferred embodiments of the present invention are not limited to this configuration and can be any configuration as long as at least one external electrode is disposed on the first major surface 10a.

For example, as illustrated in FIG. 8, the first and second external electrodes 13 and 14 may be disposed so as to cover the first major surface 10a and one of the first and second end surfaces 10e and 10f. That is, the first and second external electrodes 13 and 14 are not limited to particular shapes as long as the first and second external electrodes 13 and 14 include the first sections 13a and 14a, respectively, and are electrically coupled to the first and second internal electrodes 11 and 12, respectively.

Third Preferred Embodiment

Figure 9:
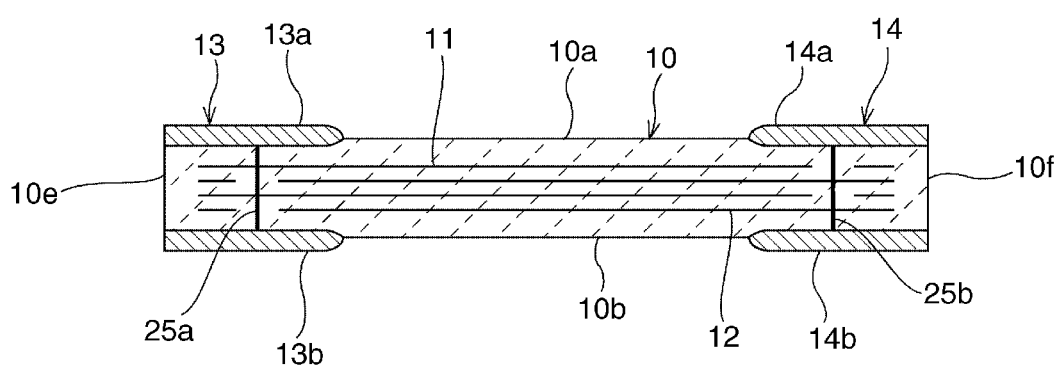
FIG. 9 is a schematic perspective view of a ceramic electronic component according to a third preferred embodiment of the present invention.

FIG. 9 is a schematic perspective view of a ceramic electronic component according to a third preferred embodiment of the present invention.

The first preferred embodiment is an example in which the first and second internal electrodes 11 and 12 extend to the first and second end surfaces 10e and 10f, respectively, the first and second external electrodes 13 and 14 are disposed on the first and second end surfaces 10e and 10f, respectively, and the first and second internal electrodes 11 and 12 are thus electrically coupled to the first and second external electrodes 13 and 14, respectively. However, preferred embodiments of the present invention are not limited to this configuration.

For example, as illustrated in FIG. 9, via-hole electrodes 25a and 25b may be provided, the first and second internal electrodes 11 and 12 may connect to the first and second major surfaces 10a and 10b, respectively, and the first and second internal electrodes 11 and 12 may be electrically coupled to the first and second external electrodes 13 and 14, respectively, at the first and second major surfaces 10a and 10b. In this case, the first and second external electrodes 13 and 14 are required to be disposed on at least one of the first and second major surfaces 10a and 10b, and the first and second external electrodes 13 and 14 do not necessarily have to be disposed on the first and second side surfaces 10c and 10d and the first and second end surfaces 10e and 10f.

EXAMPLE 1

By the manufacturing method described in the above-described first preferred embodiment, 100 ceramic electronic components having substantially the same configuration as in the ceramic electronic component 1 of the first preferred embodiment were produced under the conditions described below. For the present example, $t_1$ was approximately 1.4 μm and approximately $(1/10)t_0$.

Conditions in Example 1

Dimensions of Ceramic Electric Component: app. 1 mm long by app. 0.5 mm wide by app. 0.15 mm deep Capacity of Ceramic Electric Component: app. 100 pF Composition of Ceramic Base: $BaTiO_3$ External Electrode: nickel plating film having a thickness of app. 14 μm ($t_0 \approx 14$ μm)

First Plating Film: copper plating film having a thickness of app. 4 μm (formed on external electrode)

Second Plating Film: copper plating film having a thickness of app. 3.5 μm (formed on first plating film)

Maximum Firing Temperature: app. 1200° C.

Thickness of Elastic bodies 24a and 24b: app. 0.1 mm

Press Pressure: app. 70 MPa

EXAMPLE 2

One hundred ceramic electronic components were produced under the same conditions as in the above-described Example 1, except that the press pressure was approximately 77.2 MPa and $t_1$ was approximately 3.5 μm and approximately $(1/4)t_0$.

EXAMPLE 3

One hundred ceramic electronic components were produced under the same conditions as in the above-described Example 1, except that the press pressure was approximately 100 MPa and $t_1$ was approximately 5.6 μm and approximately $(2/5)t_0$.

Comparative Example 1

Figure 10:
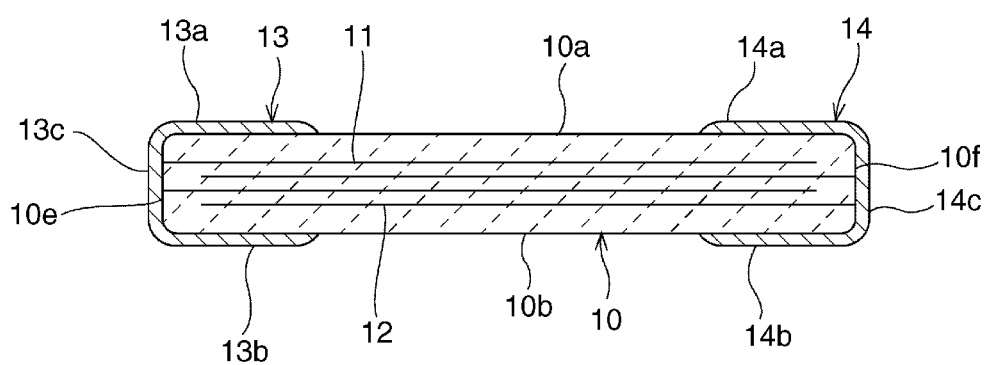
FIG. 10 is a schematic cross-sectional view of a ceramic electronic component according to Comparative Example 1.

One hundred ceramic electronic components were produced under the same conditions as in the above-described Example 1, except that the thickness of each of the elastic bodies 24a and 24b was approximately 0.2 mm, the press pressure was approximately 50 MPa, the external electrodes were not embedded, and $t_1$ was approximately zero, as illustrated in FIG. 10.

Comparative Example 2

Figure 11:
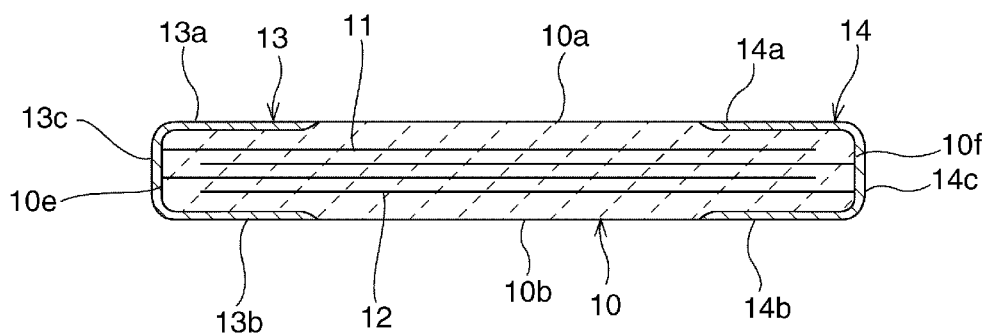
FIG. 11 is a schematic cross-sectional view of a ceramic electronic component according to Comparative Example 2.

One hundred ceramic electronic components were produced under the same conditions as in the above-described Example 1, except that the elastic bodies 24a and 24b were replaced with rigid bodies, the press pressure was approximately 77.2 MPa, and $t_1$ was approximately 7.0 μm and approximately $(1/2)t_0$, as illustrated in FIG. 11.

In the description of Comparative Examples, for the sake of the description, members having a substantially common function to that in the above-described first preferred embodiment are referred to by the common reference numerals.

Bonding Strength Test

For the 100 ceramic electronic components produced in each of Examples 1 to 3 and Comparative Examples 1 and 2, the first and second sections in each of the first and second external electrodes were observed by the use of an optical microscope and checked for the presence or absence of separation. The number of samples in which separation was observed is shown in Table 1 below.

Electrostatic Capacity Test

For 30 randomly taken from 100 ceramic electronic components produced in each of Examples 1 to 3 and Comparative Examples 1 and 2, the electrostatic capacity was measure by the use of a C meter 4278A of Agilent Technologies and checked for whether the electrostatic capacity has reached a target electrostatic capacity (100 pF). The number of samples in which the electrostatic capacity has not reached the target electrostatic capacity (100 pF) is shown in Table 1 below.

TABLE 1

| | COMPARATIVE EXAMPLE 1 | EXAMPLE 1 | EXAMPLE 2 | EXAMPLE 3 | COMPARATIVE EXAMPLE 2 |
|---|---|---|---|---|---|
| $t_0$ (μm) | 14 | 14 | 14 | 14 | 14 |
| $t_1$ (μm) | 0 | 1.4 | 3.5 | 5.6 | 7 |
| $t_1/t_0$ | 0 | 1/10 | 1/4 | 2/5 | 1/2 |
| $(1/10)t_0$ | 1.4 | 1.4 | 1.4 | 1.4 | 1.4 |
| $(2/5)t_0$ | 5.6 | 5.6 | 5.6 | 5.6 | 5.6 |
| BONDING STRENGTH TEST | 3/100 | 0/100 | 0/100 | 0/100 | 0/100 |
| ELECTROSTATIC CAPACITY TEST | 0/30 | 0/30 | 0/30 | 0/30 | 1/30 |

The results of Table 1 above reveal that high reliability is achieved if the condition $(1/10)t_0 \leq t_1 \leq (2/5)t_0$ is satisfied.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
   a ceramic base that includes first and second opposed major surfaces extending along a longitudinal direction and a width direction, first and second opposed side surfaces extending along the longitudinal direction and a thickness direction, and first and second opposed end surfaces extending along the width direction and the thickness direction;
   first and second internal electrodes disposed in the ceramic base such that at least a portion of the first internal electrode is opposed to the second internal electrode in the thickness direction;
   a first external electrode that includes a first section disposed on a first end portion of the first major surface in the longitudinal direction and that is electrically coupled to the first internal electrode; and
   a second external electrode that includes a first section disposed on a second end portion of the first major surface and that is electrically coupled to the second internal electrode; wherein
   a region where the first and second internal electrodes are opposed to each other in the thickness direction defines an effective region that exhibits a specific electric characteristic;
   a plating layer disposed on the first and second external electrodes;
   the first section of each of the first and second external electrodes is opposed to the effective region in the thickness direction;
   the first section of each of the first and second external electrodes is embedded in the ceramic base along the thickness direction; and
   $(1/10)t_0 \leq t_1 \leq (2/5)t_0$ is satisfied, where t0 is a thickness of the first section of each of the first and second external electrodes and t1 is a thickness of a portion in which the first section of each of the first and second external electrodes is embedded in the ceramic base.

2. The ceramic electronic component according to claim 1, wherein
   the first external electrode further includes a second section disposed on a first end portion of the second major surface in the longitudinal direction and a third section disposed on the first end surface of the ceramic body; and
   the second external electrode further includes a second section disposed on a second end portion of the second major surface in the longitudinal direction and a third section disposed on the second end surface of the ceramic body.

3. The ceramic electronic component according to claim 1, wherein each of the first and second external electrodes includes an inorganic binder.

4. The ceramic electronic component according to claim 3, wherein the inorganic binder is at least one of a ceramic material and a glass material.

5. The ceramic electronic component according to claim 3, wherein a content of the inorganic binder in each of the first and second external electrodes is in a range of about 40% by volume to about 60% by volume.

6. The ceramic electronic component according to claim 1, wherein the thickness $t_0$ is in a range of about 3 μm to about 20 μm.

7. The ceramic electronic component according to claim 1, wherein the first external electrode further includes a second section disposed on the first end surface of the ceramic body; and
   the second external electrode further includes a second section disposed on the second end surface of the ceramic body.

8. The ceramic electronic component according to claim 7, wherein no section of either of the first and second external electrodes is disposed on the second major surface.

9. The ceramic electronic component according to claim 1, wherein
   the first external electrode is electrically coupled to the first internal electrode by a first via-hole electrode; and
   the second external electrode is electrically coupled to the second internal electrode by a second via-hole electrode.

10. The ceramic electronic component according to claim 9, wherein the first and second via-hole electrodes extend in a direction from the first major surface to the second major surface.

11. The ceramic electronic component according to claim 9, wherein
- the first external electrode further includes a second section disposed on a first end portion of the second major surface in the longitudinal direction;
- the second external electrode further includes a second section disposed on a second end portion of the second major surface in the longitudinal direction;
- ends of the first via-hole electrode are directly electrically and physically connected to the first and second sections of the first external electrode; and
- ends of the second via-hole electrode are directly electrically and physically connected to the first and second sections of the second external electrode.

\* \* \* \* \*